(12) United States Patent
Chen et al.

(10) Patent No.: US 10,224,254 B2
(45) Date of Patent: Mar. 5, 2019

(54) PACKAGE PROCESS METHOD INCLUDING DISPOSING A DIE WITHIN A RECESS OF A ONE-PIECE MATERIAL

(71) Applicant: POWERTECH TECHNOLOGY INC., Hsinchu County (TW)

(72) Inventors: Ming-Chih Chen, Hsinchu County (TW); Hsien-Wen Hsu, Hsinchu County (TW); Yuan-Fu Lan, Hsinchu County (TW); Hung-Hsin Hsu, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/497,219

(22) Filed: Apr. 26, 2017

(65) Prior Publication Data

US 2018/0315674 A1    Nov. 1, 2018

(51) Int. Cl.
| | |
|---|---|
| *H01L 23/043* | (2006.01) |
| *H01L 23/06* | (2006.01) |
| *H01L 23/31* | (2006.01) |
| *H01L 21/82* | (2006.01) |
| *H01L 23/498* | (2006.01) |
| *H01L 23/00* | (2006.01) |
| *H01L 23/48* | (2006.01) |

(52) U.S. Cl.
CPC ............ *H01L 23/043* (2013.01); *H01L 21/82* (2013.01); *H01L 23/06* (2013.01); *H01L 23/315* (2013.01); *H01L 23/3114* (2013.01); *H01L 23/481* (2013.01); *H01L 23/49827* (2013.01); *H01L 24/10* (2013.01); *H01L 24/11* (2013.01); *H01L 2221/1068* (2013.01); *H01L 2224/10* (2013.01); *H01L 2224/11* (2013.01)

(58) Field of Classification Search
CPC ..... H01L 23/043; H01L 23/049; H01L 23/12; H01L 23/14; H01L 23/142
See application file for complete search history.

(56) References Cited

U.S. PATENT DOCUMENTS

| | | |
|---|---|---|
| 8,288,209 B1 | 10/2012 | Chi |
| 8,513,062 B2 | 8/2013 | Nikitin |
| 2007/0108585 A1* | 5/2007 | Pavier ................. H01L 23/3128 257/690 |

(Continued)

FOREIGN PATENT DOCUMENTS

| | | |
|---|---|---|
| TW | 201216426 A1 | 4/2012 |
| TW | 201426965 A | 7/2014 |

*Primary Examiner* — Wael M Fahmy
*Assistant Examiner* — Sarah Kate Salerno
(74) *Attorney, Agent, or Firm* — Winston Hsu

(57) ABSTRACT

A package structure may include a one-piece metal carrier, a die, a mold layer and a redistribution layer. The one-piece metal carrier may include a bottom portion and a first supporting structure, and the one-piece metal carrier may have a recess defined by the bottom portion and the first supporting structure. The die may be disposed in the recess of the one-piece metal carrier, and the die may have a plurality of conductive bumps. The mold layer may be formed to encapsulate the die. The mold layer may expose a portion of each of the plurality of conductive bumps and a portion of the first supporting structure. The redistribution layer may be disposed on the mold layer and electrically connected to the plurality of conductive bumps.

20 Claims, 19 Drawing Sheets

(56) References Cited

U.S. PATENT DOCUMENTS

| | | | |
|---|---|---|---|
| 2011/0217837 A1* | 9/2011 | Kuratani | B81B 7/007 |
| | | | 438/612 |
| 2011/0291249 A1 | 12/2011 | Chi | |
| 2014/0367848 A1 | 12/2014 | Chi | |
| 2015/0130046 A1 | 5/2015 | Lin | |
| 2017/0135219 A1* | 5/2017 | Hsu | H01L 21/4857 |

* cited by examiner

PACKAGE PROCESS METHOD INCLUDING DISPOSING A DIE WITHIN A RECESS OF A ONE-PIECE MATERIAL

BACKGROUND OF THE INVENTION

1. Field of the Invention

The present invention is related to a package process method, and more particularly, a package process method including disposing a die within a recess of a one-piece material.

2. Description of the Prior Art

In the process of chip packaging, a fan-out structure may be used. When packaging a chip with a large number of I/O (input/output) interfaces and small pitches among the I/O interfaces, a fan-out structure may extend the pitches among the I/O interfaces of the chip by electrically connecting the I/O interfaces to another set of conductive interfaces with larger pitches via a fan-out circuit. Using a fan-out structure to extend the pitches of the I/O interfaces may improve the yield and simplify the packaging process. The described I/O interfaces of the chip may be solder balls of a ball-grid-array (BGA), for example. The abovementioned structure may extend the pitch of the I/O interfaces, but the electromagnetic interference protection, the heat dissipation and the structural strength may still be not ideal.

SUMMARY OF THE INVENTION

An embodiment of the present invention may provide a package structure. The package structure may include a one-piece metal carrier, a die, a mold layer and a redistribution layer. The one-piece metal carrier may include a bottom portion and a first supporting structure, and the one-piece metal carrier may have a recess defined by the bottom portion and the first supporting structure. The die may be disposed in the recess of the one-piece metal carrier, and the die may have a plurality of conductive bumps. The mold layer may be formed to encapsulate the die. The mold layer may expose a portion of each of the plurality of conductive bumps and a portion of the first supporting structure. The redistribution layer may be disposed on the mold layer and electrically connected to the plurality of conductive bumps.

An embodiment of the present invention may provide a package process method. The package process method may include forming a one-piece metal carrier having a bottom portion and a first supporting structure, the bottom portion and the first supporting structure forming a recess; disposing a die within the recess; forming a mold layer to encapsulate the die; grinding the mold layer to expose a portion of each of a plurality of conductive bumps of the die and a portion of the first supporting structure; and forming a redistribution layer on the mold layer, wherein the redistribution layer is electrically connected to the plurality of conductive bumps.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
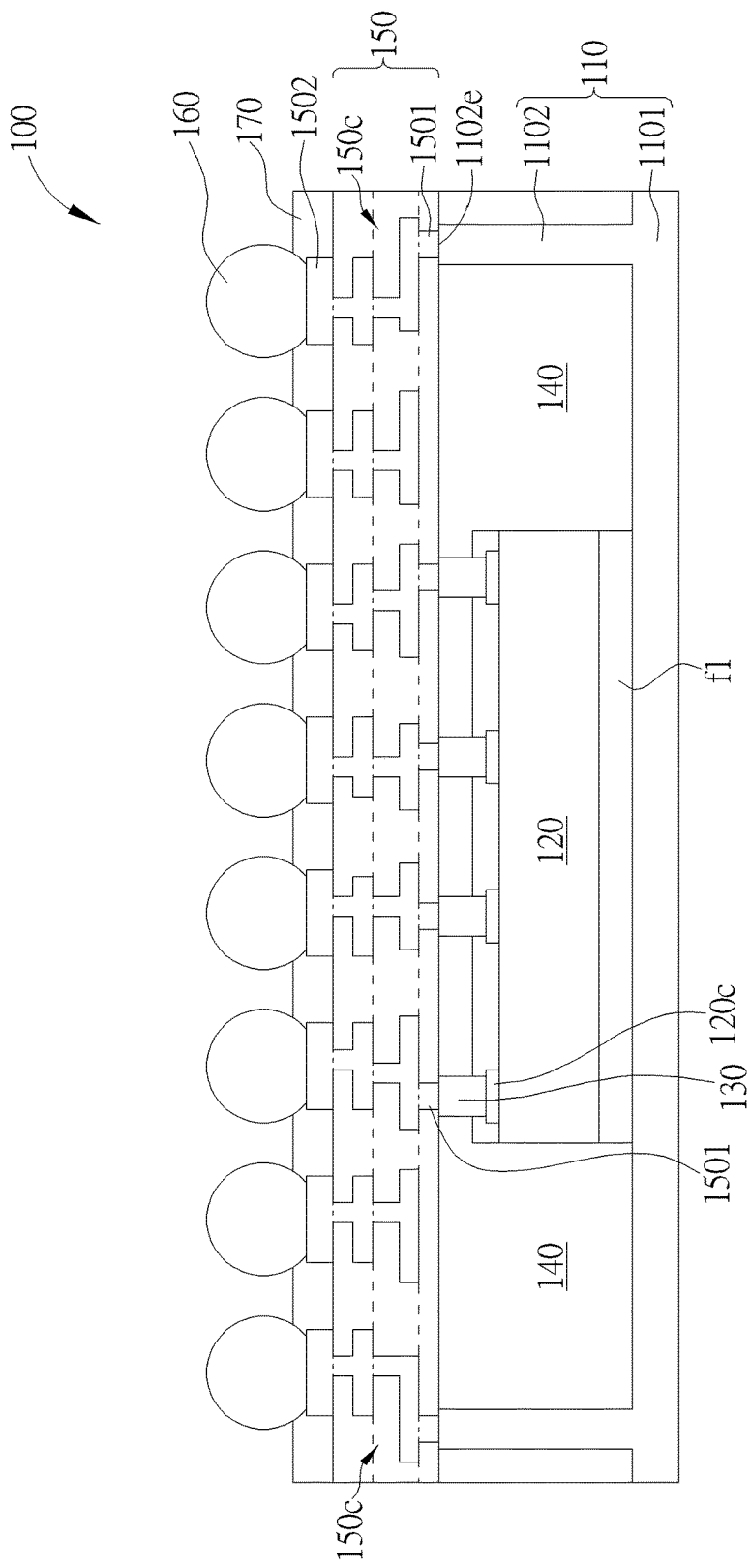
FIG. 1 illustrates a package structure according to an embodiment of the present invention.

FIG. 1 illustrates a package structure 100 according to an embodiment of the present invention. The package structure 100 may include a one-piece metal carrier 110, a die 120, a plurality of conductive bumps 130, a mold layer 140, a redistribution layer 150, and a plurality of first solder balls 160. The one-piece metal carrier 110 may have a bottom portion 1101, a first supporting structure 1102, and a recess defined by the bottom portion 1101 and the first supporting structure 1102 surrounding the recess. The one-piece metal carrier 110, including the bottom portion 1101 and the first supporting structure 1102, may be formed by etching a single conductive substrate to form the one-piece metal carrier 110. Being formed from a conductive substrate makes the one-piece metal carrier 110 stronger and more sustaining. In addition, the bottom portion 1101 may provide isolation and protection against electromagnetic interference (EMI). The one-piece metal carrier 110 may be of a low thermal capacity. The structure of the one-piece metal carrier 110 may further act as a heatsink to dissipate heat for the die 120. Hence, the EMI protection, heat dissipation, strength, and reliability of the package structure 100 may be improved.

The die 120 may have a plurality of functional interfaces 120c. Conductive bumps 130 may be formed on the functional interfaces 120c of the die 120 correspondingly. The die 120 is placed within the recess for thermal coupling with the bottom portion 1101. A protection layer f1 may be disposed between the die 120 and the bottom portion 1101. The protection layer f1 may be an adhesive layer or a film such as a die attach film (DAF) to adhere the die 120 to the one-piece metal carrier 110. The mold layer 140 may be then formed by filling the recess with a mold material and encapsulating the die 120. The mold layer 140 may be grinded to expose a corresponding surface of the plurality of conductive bumps 130 and the first supporting structure 1102. Thus, a plurality of exposed conductive bumps 130 and an exposed surface 1102e of the first supporting structure 1102 may be obtained.

The first supporting structure 1102 may be electrically connected to the ground or a voltage supply according to an embodiment of the present invention. The redistribution layer 150 is formed on top of the mold layer, exposed conductive bumps, and the exposed surface 1102e of the first supporting structure 1102 and may have one or more layer dependent on the routing need of the electronic circuit. The redistribution layer 150 may include a plurality of first interfaces 1501, circuitry 150*c*, and a plurality of second interfaces 1502. The interfaces 1501 may be coupled to the exposed conductive bumps 130 and the exposed surface 1102*e* of the first supporting structure 1102 correspondingly. The second interfaces 1502 may be electrically connected with the interfaces 1501 of the redistribution layer 150 via the circuitry 150*c*. The first solder balls 160 may be disposed on the interfaces 1502 of the redistribution layer 150 correspondingly.

As shown in FIG. 1, a solder mask layer 170 may be formed to cover regions except for the interfaces 1502 of the redistribution layer 150. The solder mask layer 170 may protect the parts of the redistribution layer 150 other than the interfaces 1502 during the soldering process.

Figure 2:
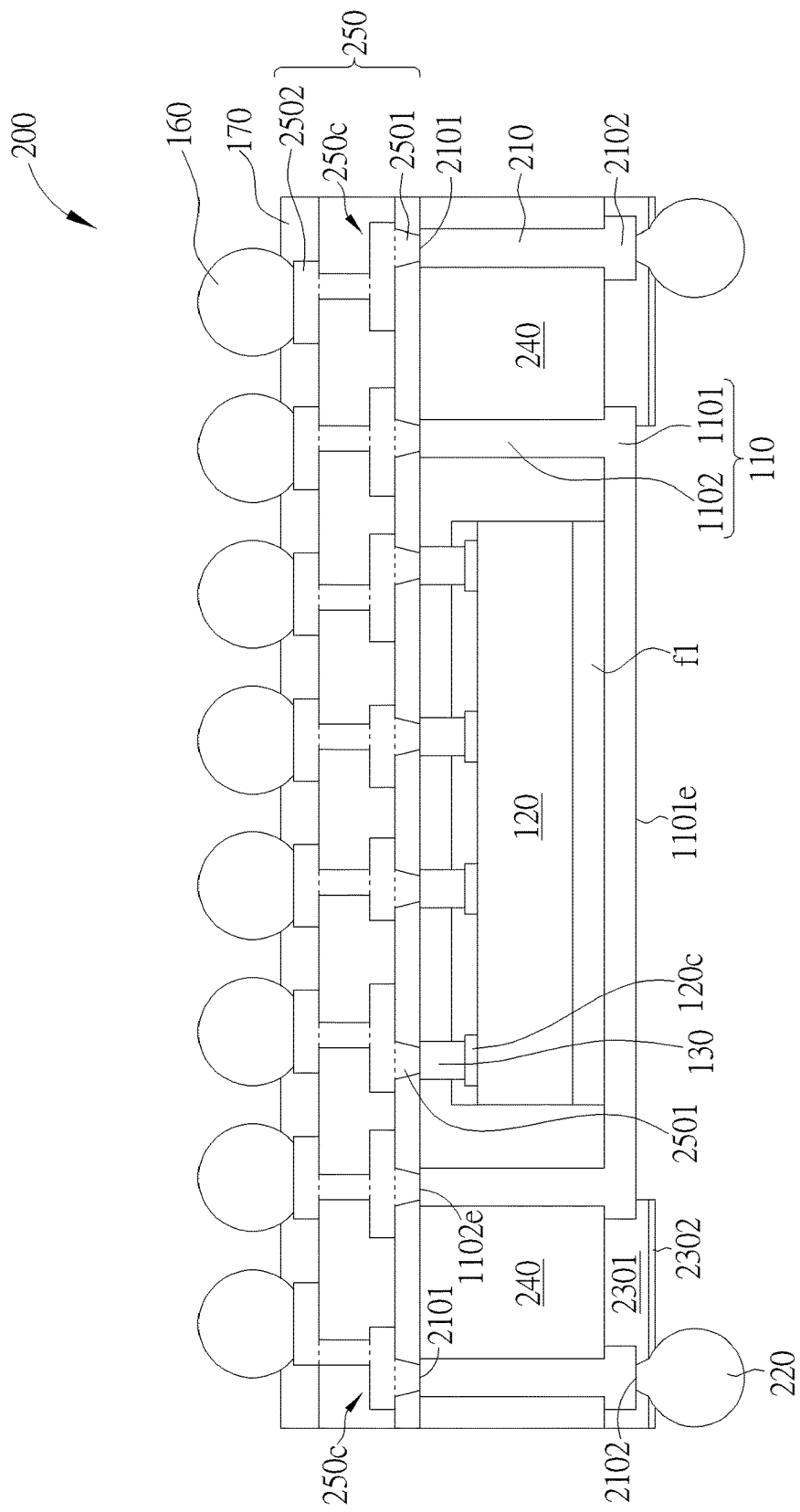
FIG. 2 illustrates a package structure according to an embodiment of the present invention.

FIG. 2 illustrates a package structure 200 according to another embodiment of the present invention. Comparing with the package structure 100 of FIG. 1, the package structure 200 may further include a second supporting structure 210 which may be formed to include a plurality of pillars 210*p* arranged in a series surrounding the first supporting structure 1102 as shown in FIG. 21. The second supporting structure 210 may also be formed together with the bottom portion 1101 and the first supporting structure 1102 when etching the one-piece metal carrier 110. When the recess is filled with the mold material 240, all space(s) formed during the etching process, for example, between the first supporting structure 1102 and the second supporting structure 210 and between the plurality of pillars 210*p* are also filled with the mold material 240. The mold compound 240 is then grinded to expose a first exposed surface (exposed from the mold layer 240) forming a plurality of first auxiliary interfaces 2101.

Figure 17:
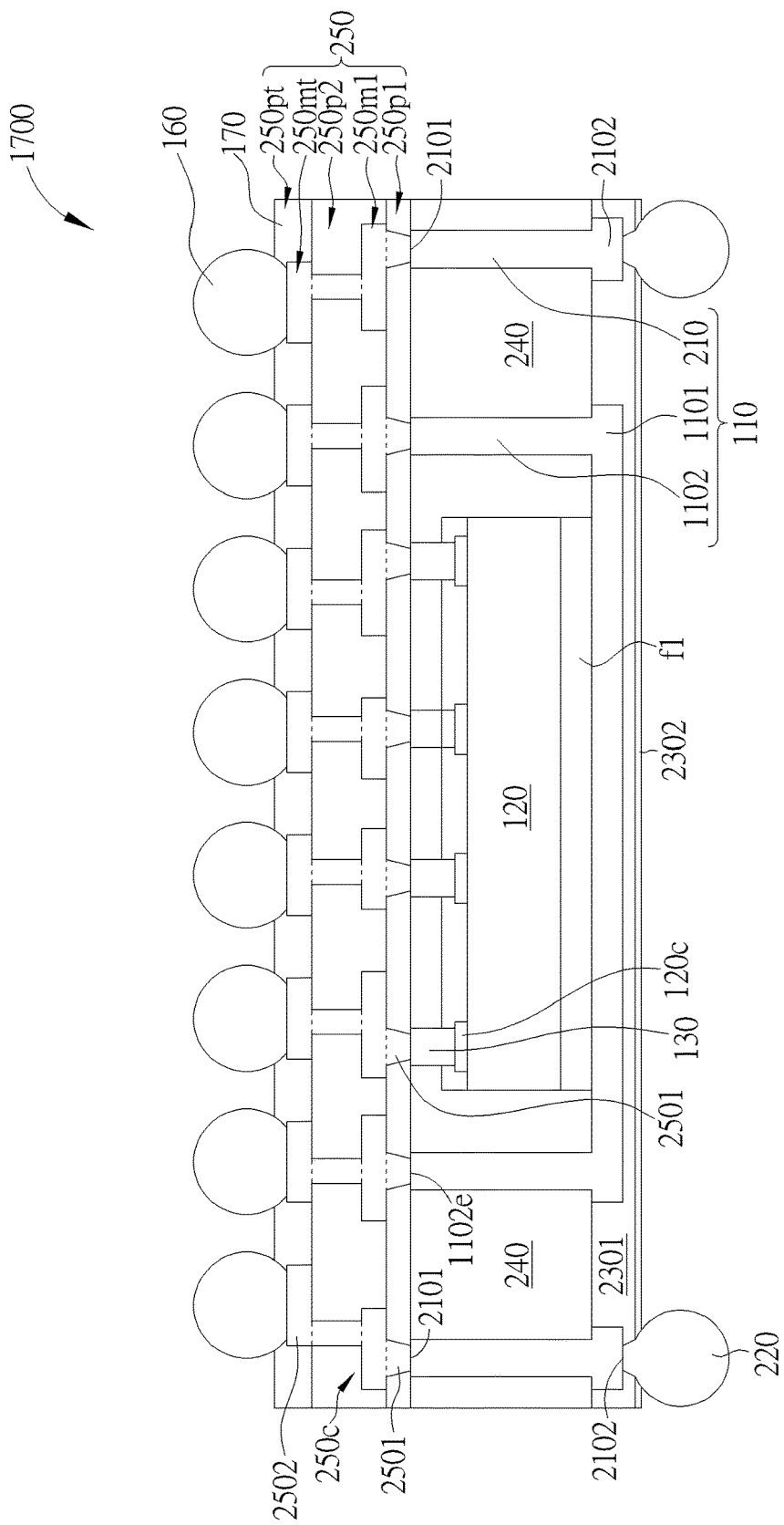

A portion of the bottom 1101 between the first supporting structure 1102 and the second supporting structure 210 and between the plurality of pillars 210*p* may then also be removed by etching the backside of the package structure 200 (defined as the side of the bottom portion 1101 opposite to the location of the die 120) to forma second exposed surface (also exposed from the mold layer 240) forming a plurality of second auxiliary interfaces 2102 and to electrically isolate the plurality of pillars 210*p* from each other and from the first supporting structure 1102. The entire backside of the package structure 200, including exposed mold compound 240 and the plurality of second auxiliary interfaces 2102, may then be covered with a dielectric material 2301. A solder mask layer 2302 may be formed on the dielectric layer 2301 to cover and protect regions except for portions of the dielectric layer 2301 located above the second auxiliary interfaces 2102. These portions of the dielectric layer 2301 are then removed to be able to the solder balls 220 on the second auxiliary interfaces 2102 for electrical connection of 0 subsequent semiconductor packages, as shown in FIG. 17.

In FIG. 2, a redistribution layer 250, similar to the redistribution layer 150 of FIG. 1, may be formed on the mold layer 240. The interfaces 2501 of the redistribution layer 250 may be disposed on the exposed conductive bumps 130, the exposed surface 1102*e* of the first supporting structure 1102 and the first auxiliary interfaces 2101. As shown in FIG. 2, a portion of the dielectric layer 2301 and the solder mask layer 2302 may be removed or not applied so as to expose the bottom portion 1101 of the one-piece metal carrier 110 for better heat dissipation. Since the bottom portion 1101 may act as an EMI shielding and a heatsink, exposing the bottom portion 1101 may improve heat dissipation. In some other embodiments, the bottom portion 1101 may be covered by the dielectric later 2301 and/or the solder mask layer 2302.

According to an embodiment, the redistribution layers 150 and 250 of FIGS. 1-2 may include a plurality of dielectric layers and a plurality of conductive layers. The dielectric layers and the conductive layers of the redistribution layer 150 and 250 may be patterned to form customized circuitry. The redistribution layer 150 or 250 may include circuitry designed according to requirements and used to redistribute electrical paths connecting the functional interfaces 120*c* of the die 120. The redistribution layers 150 and 250 may provide fan-out circuitry to extend the smaller pitches among the interfaces 120*c* to the larger pitches among the solder balls 160. According to an embodiment, the dielectric layers of the redistribution layer 150 and 250 may include at least a photosensitive layer to be patterned using light with a suitable wavelength. According to an embodiment, the conductive layers of the redistribution layer 150 and 250 may further include at least a sputter seed layer.

As shown in FIGS. 1-2, the first supporting structure 1102 and second supporting structure 210 may act as supporting pillars to reinforce the structure. The first supporting structure 1102 may be etched to a size as needed to improve the heat dissipating capability. The second supporting structure 210 may be formed as a set of electrically isolated pillars.

Figure 3:
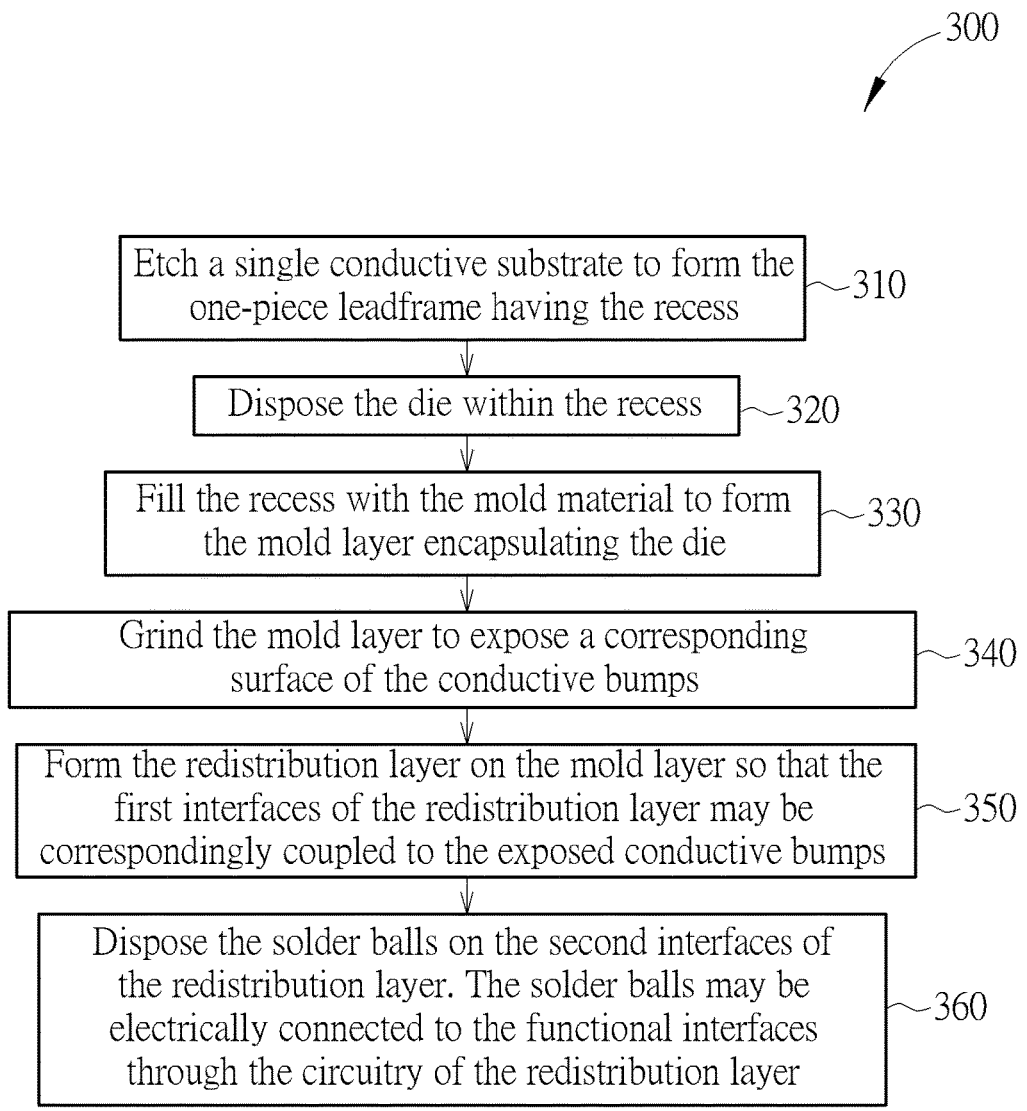
FIG. 3 illustrates a flowchart of a method for manufacturing the package structure of FIG. 1 according to an embodiment of the present invention.

FIG. 3 illustrates a flowchart of a package method 300 for manufacturing the package structure 100 of FIG. 1 according to an embodiment of the present invention. FIGS. 4-10 illustrate the package structure 100 in process corresponding to the steps of FIG. 3. The package method 300 may include:

Step 310: etch a single conductive substrate to form the one-piece metal carrier 110 having the recess 110*r*;

Step 320: dispose the die 120 within the recess 110*r*;

Step 330: fill the recess 110*r* with the mold material to form the mold layer 140 encapsulating the die 120;

Step 340: grind the mold layer 140 to expose a corresponding surface of the conductive bumps 130;

Step 350: form the redistribution layer 150 on the mold layer 140 so that the first interfaces 1501 of the redistribution layer 150 may be correspondingly coupled to the exposed conductive bumps 130; and Step 360: dispose the solder balls 160 on the second interfaces 1502 of the redistribution layer 150. The solder balls 160 may be electrically connected to the functional interfaces 120*c* through the circuitry 150*c* of the redistribution layer 150.

Figure 4:
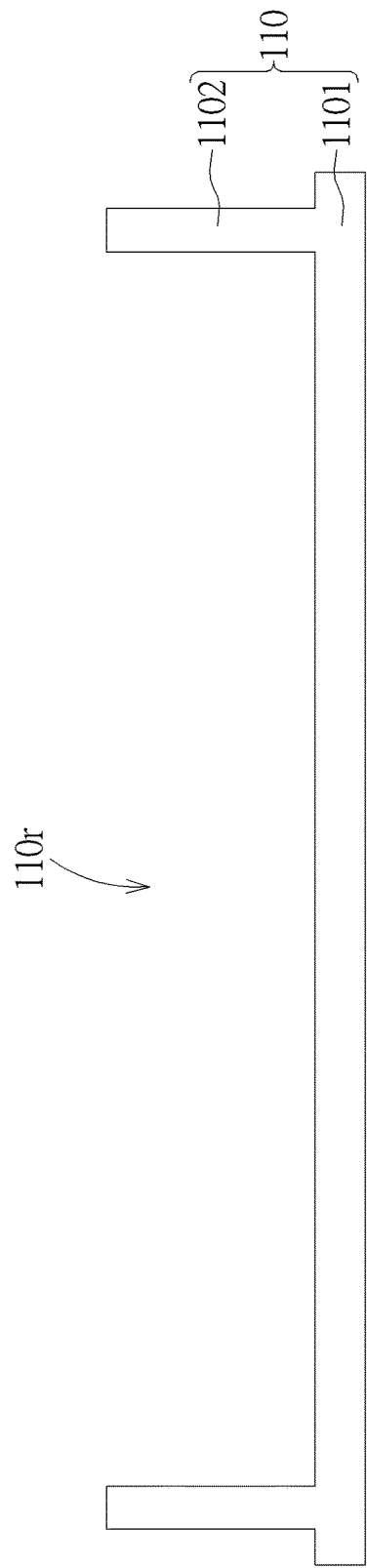
FIGS. 4-10 illustrate the package structure in process corresponding to the steps of FIG. 3.
Figure 5:
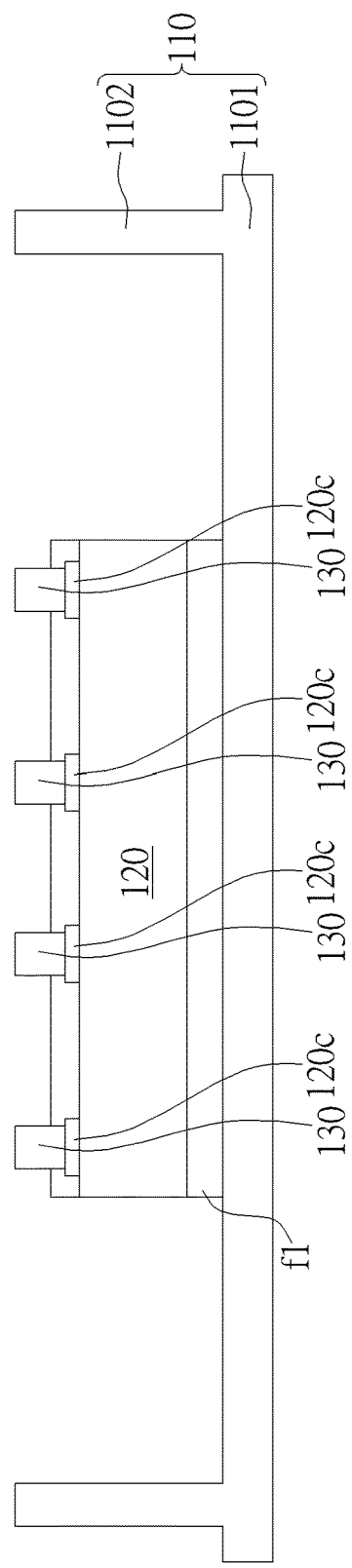
Figure 6:
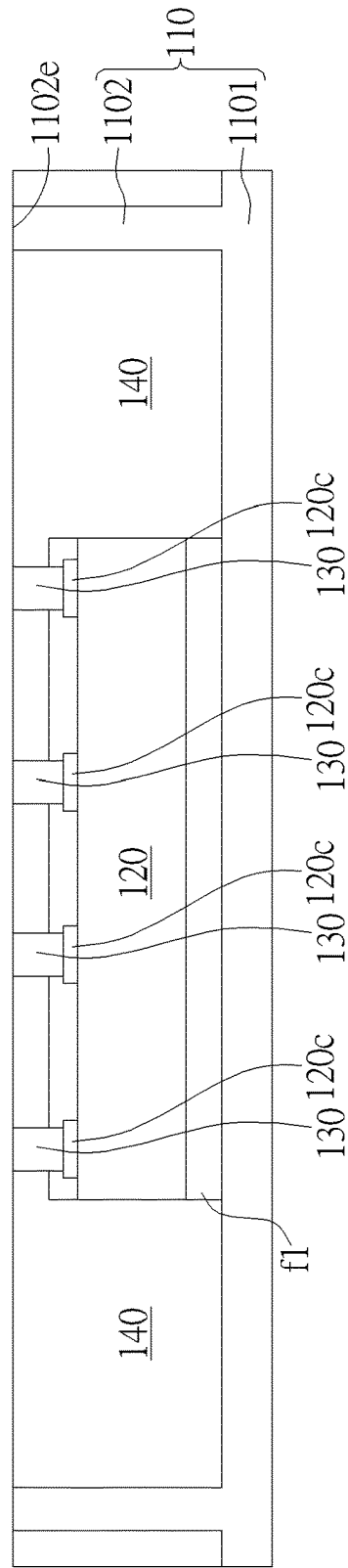
Figure 7:
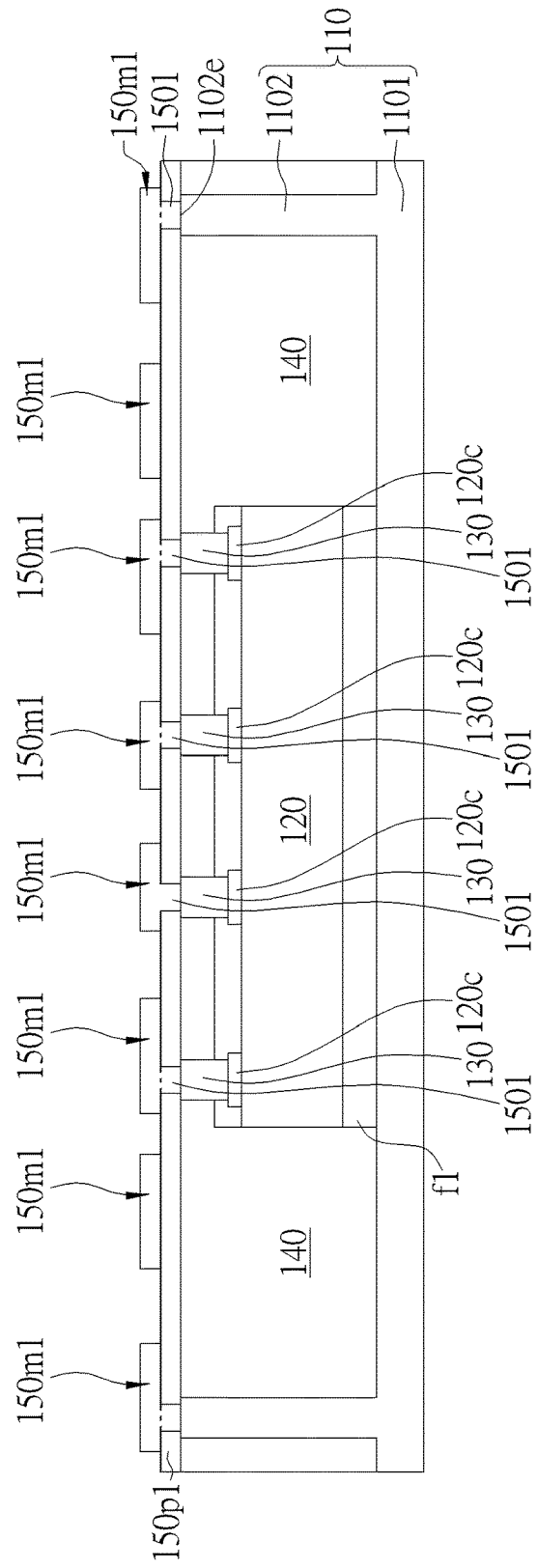
Figure 8:
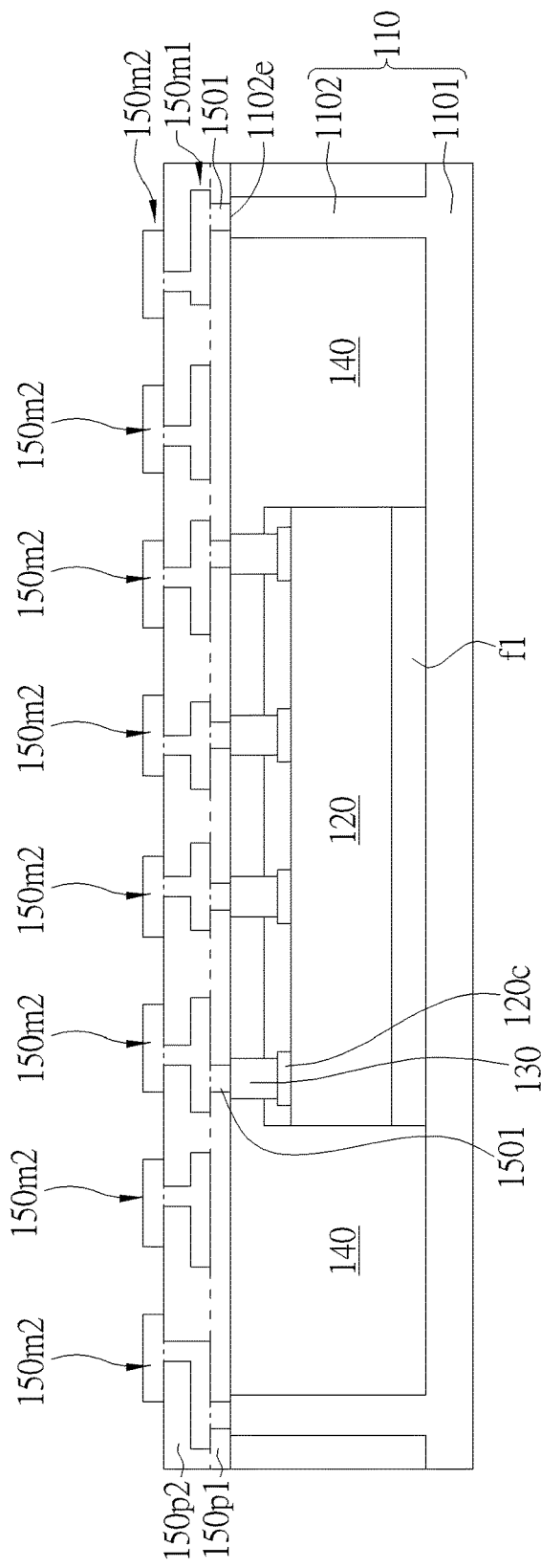
Figure 9:
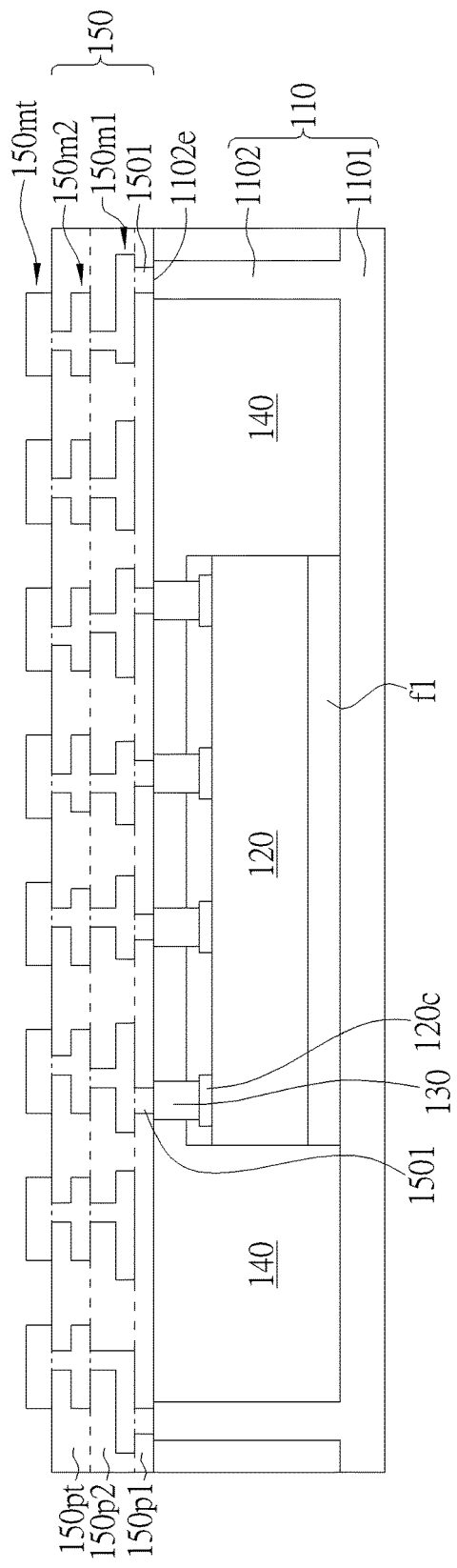
Figure 10:
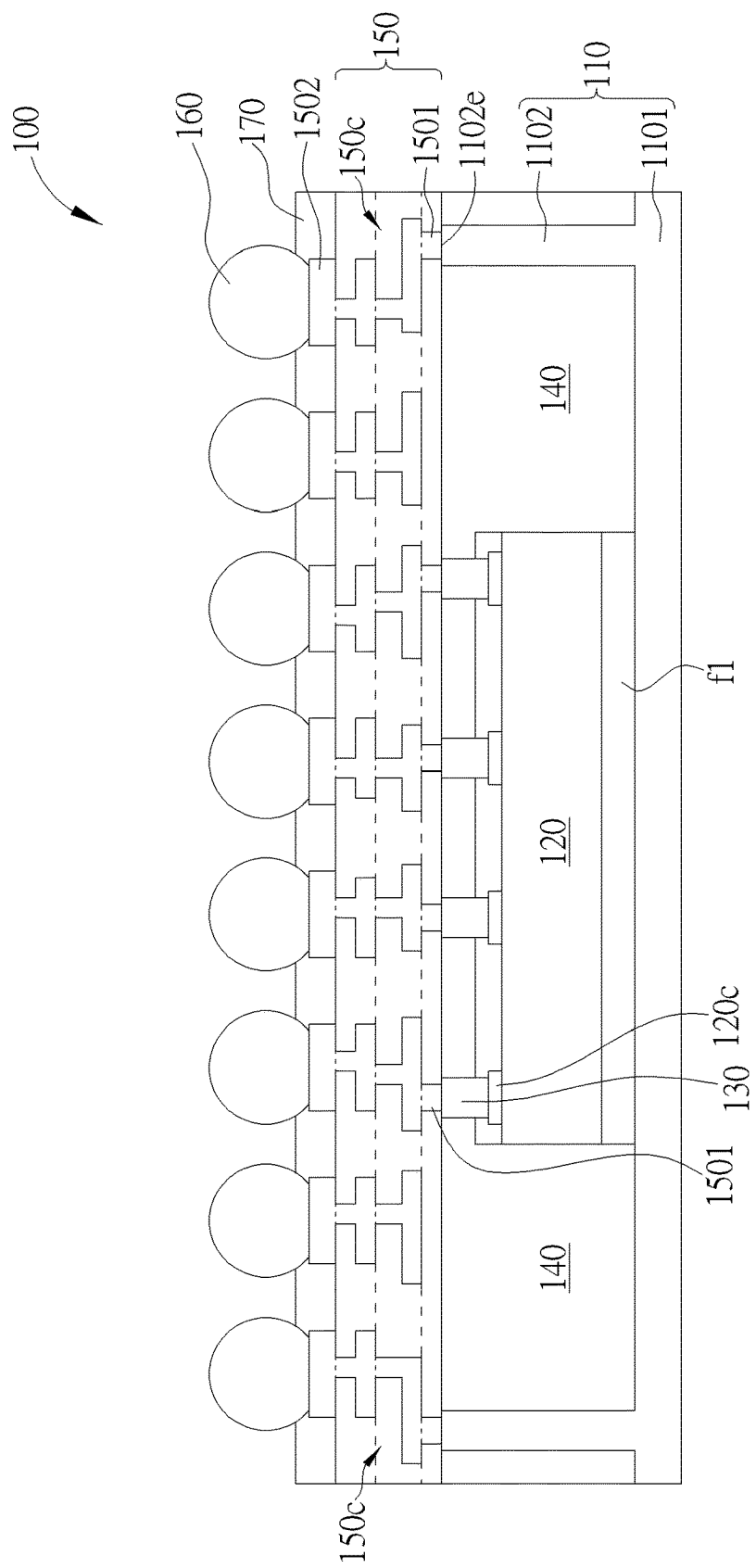

FIG. 4 may correspond to Step 310. FIG. 5 may correspond to Steps 320. FIG. 6 may correspond to Steps 330-340. FIGS. 7-9 may correspond to Steps 350. FIG. 10 may correspond to Step 360.

In Step 310, the bottom portion 1101 of the recess 110*r* may substantially form a right angle with the first supporting structure 1102. Due to the etching process, the bottom portion 1101 may not be completely flat. However, since the curvature of the bottom portion 1101 of the recess 110*r* may be negligible and the size of the die may be small enough for the die 120 to be disposed stably within the recess 110*r*. As shown in FIG. 5, the protection layer f1 may be disposed between the die 120 and the recess 110*r* to adhere the die 120 to the bottom portion 1101 during Step 320.

The conductive bumps 130 may be copper pillars formed or disposed by a pillar bump process to electrically connect to the functional interfaces of the die 120 correspondingly. In some embodiments, the conductive bumps 130 may already be formed on the die 120 before the die 120 is disposed on the one-piece metal carrier 110. In addition to copper, other suitable conductive materials may be used to form the conductive bumps 130.

In Step 360, a solder mask layer 170 may protect parts of the redistribution layer 150 other than the interfaces 1502 during the soldering process. As shown in FIGS. 7-9, the dielectric layers 150p1, 150p2 and 150pt and the conductive layers 150m1, 150m2 and 150mt may be formed and patterned layer by layer to form the redistribution layer 150.

The conductive layers 150m1, 150m2 and 150mt may be patterned by removing undesired portions. A first photoresist layer, a second photoresist layer and a third photoresist layer may be used to pattern the conductive layers 150m1, 150m2 and 150mt respectively. The circuitry 150c may be formed using at least the conductive layers 150m1, 150m2 and 150mt. In FIGS. 7-10, the redistribution layer 150 may include three dielectric layers and three conductive layers. However, FIGS. 7-10 merely provides an example. According to other embodiments of the present invention, other reasonable numbers of dielectric layers and conductive layers may be used to form the redistribution layer 150. For example, the redistribution layer 150 may merely include one patterned dielectric layer and one patterned conductive layer to form the interfaces 1501 and 1502 of the redistribution layer 150 according to an embodiment of the present invention. According to another embodiment, the redistribution layer 150 may include one or more dielectric layers, and one or more conductive layers. A suitable material may be disposed on the interfaces 1502 to be under bump metallurgy (UBM) interfaces under the solder balls 160.

Since the abovementioned process may be performed to produce a plurality of the package structures 100 connected together and arranged in an array, a cutting process (a.k.a. singulation process) may be performed to separate the package structures 100 from one another after the package structures 100 have been manufactured. The cutting process may include mechanical sawing, laser cutting and so forth.

Figure 11:
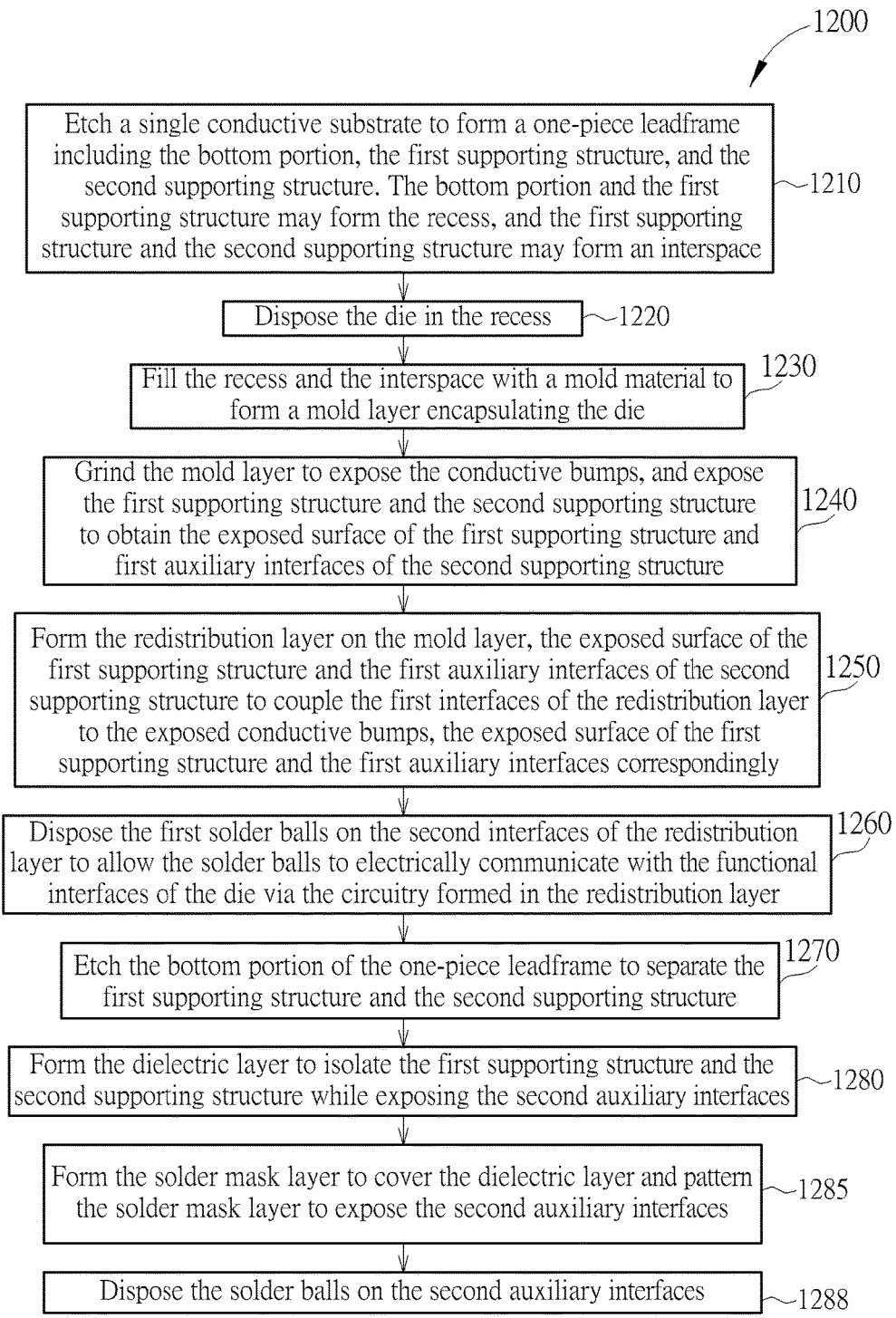
FIG. 11 illustrates a flowchart of a package method for manufacturing the package structure of FIG. 2 according to an embodiment of the present invention.

FIG. 11 illustrates a flowchart of a package method 1200 for manufacturing the package structure 200 of FIG. 2 according to an embodiment of the present invention. FIGS. 12-17 illustrate the package structure 200 during the steps of FIG. 11. The package method 1200 may include:

Step 1210: etch a single conductive substrate to form a one-piece metal carrier 110 including the bottom portion 1101, the first supporting structure 1102, and the second supporting structure 210. The bottom portion 1101 and the first supporting structure 1102 may form the recess 110r, and the first supporting structure 1102 and the second supporting structure 210 may form an interspace 110i;

Step 1220: dispose the die 120 in the recess 110r;

Step 1230: fill the recess 110r and the interspace 110 with a mold material to form a mold layer 240 encapsulating the die 120;

Step 1240: grind the mold layer 240 to expose the conductive bumps 130, and expose the first supporting structure 1102 and the second supporting structure 210 to obtain the exposed surface 1102e of the first supporting structure 1102 and first auxiliary interfaces 2101 of the second supporting structure 210;

Step 1250: form the redistribution layer 250 on the mold layer 240, the exposed surface 1120e of the first supporting structure 1102, and the first auxiliary interfaces 2101 of the second supporting structure 210 to correspondingly couple the first interfaces 2501 of the redistribution layer 250 to the exposed conductive bumps 130, the exposed surface 1102e of the first supporting structure 1102, and the first auxiliary interfaces 2101;

Step 1260: dispose the first solder balls 160 on the second interfaces 2502 of the redistribution layer 250 to allow the solder balls 160 to electrically communicate with the functional interfaces 120c of the die 120 via the circuitry 250c formed in the redistribution layer 250;

Step 1270: etch the bottom portion 1101 of the one-piece metal carrier 110 to separate the first supporting structure 1102 and the second supporting structure 210;

Step 1280: form the dielectric layer 2301 to isolate the first supporting structure 1102 and the second supporting structure 210 while exposing the second auxiliary interfaces 2102;

Step 1285: form the solder mask layer 2302 to cover the dielectric layer 2301 and pattern the solder mask layer 2302 to expose the second auxiliary interfaces 2102; and Step 1288: dispose the solder balls 220 on the second auxiliary interfaces 2102.

Figure 12:
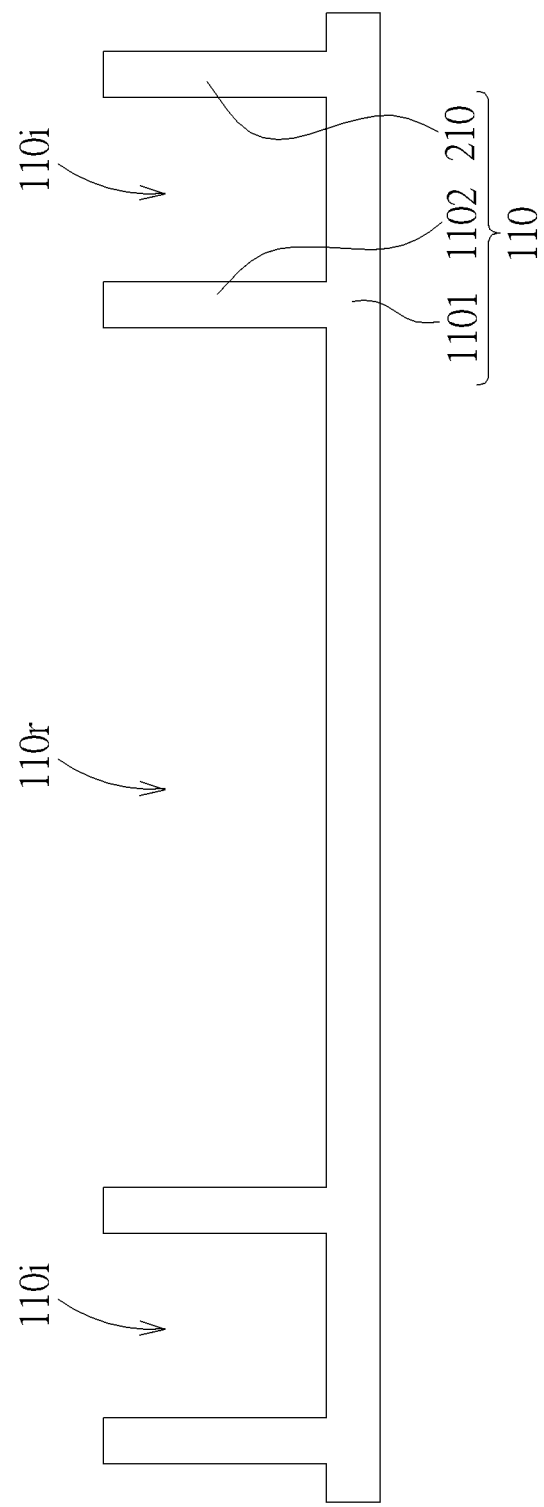
FIGS. 12-17 illustrate the package structure in process corresponding to the steps of FIG. 11.
Figure 13:
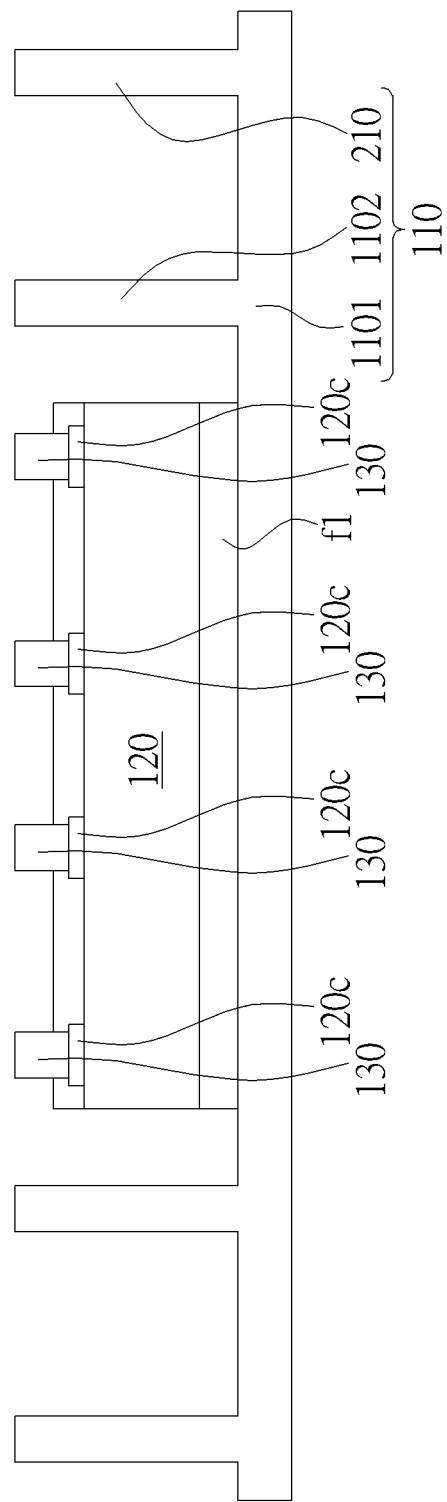
Figure 14:
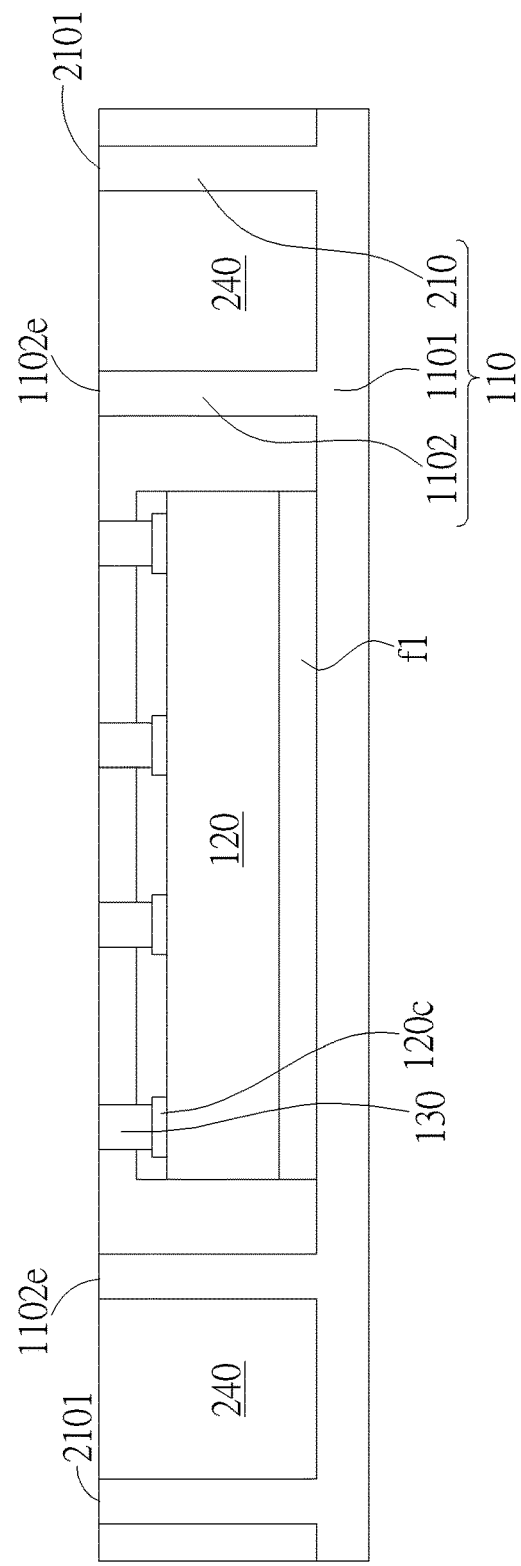
Figure 15:
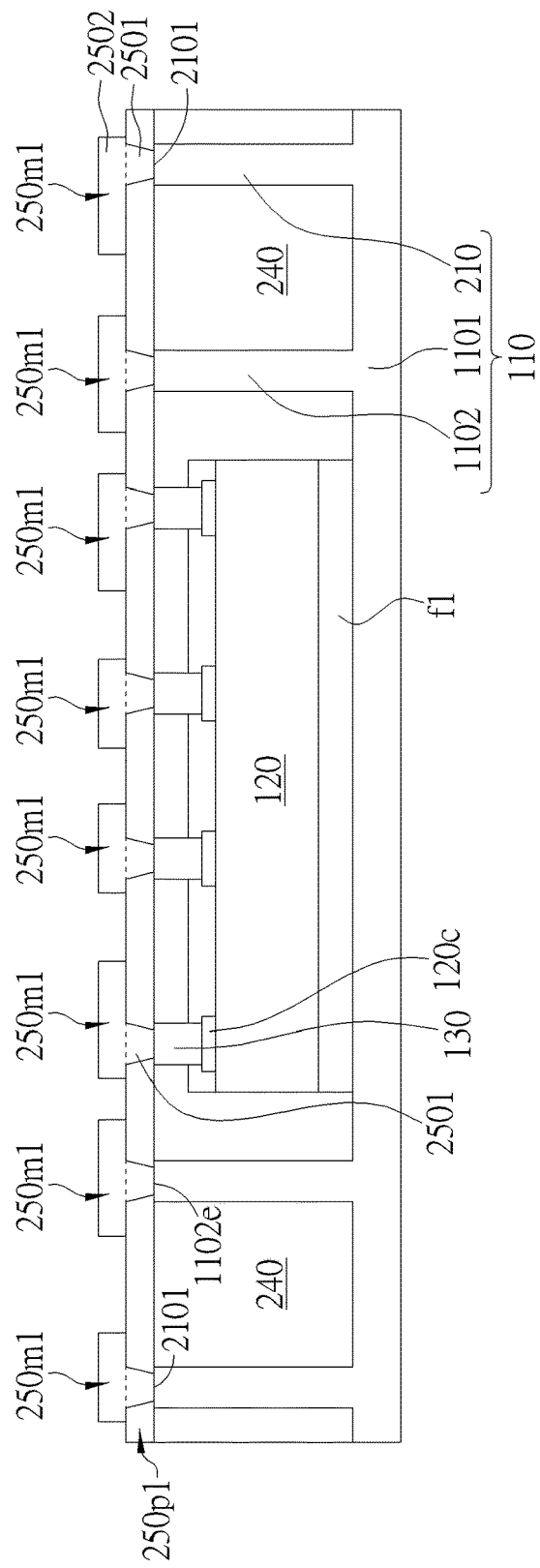
Figure 16:
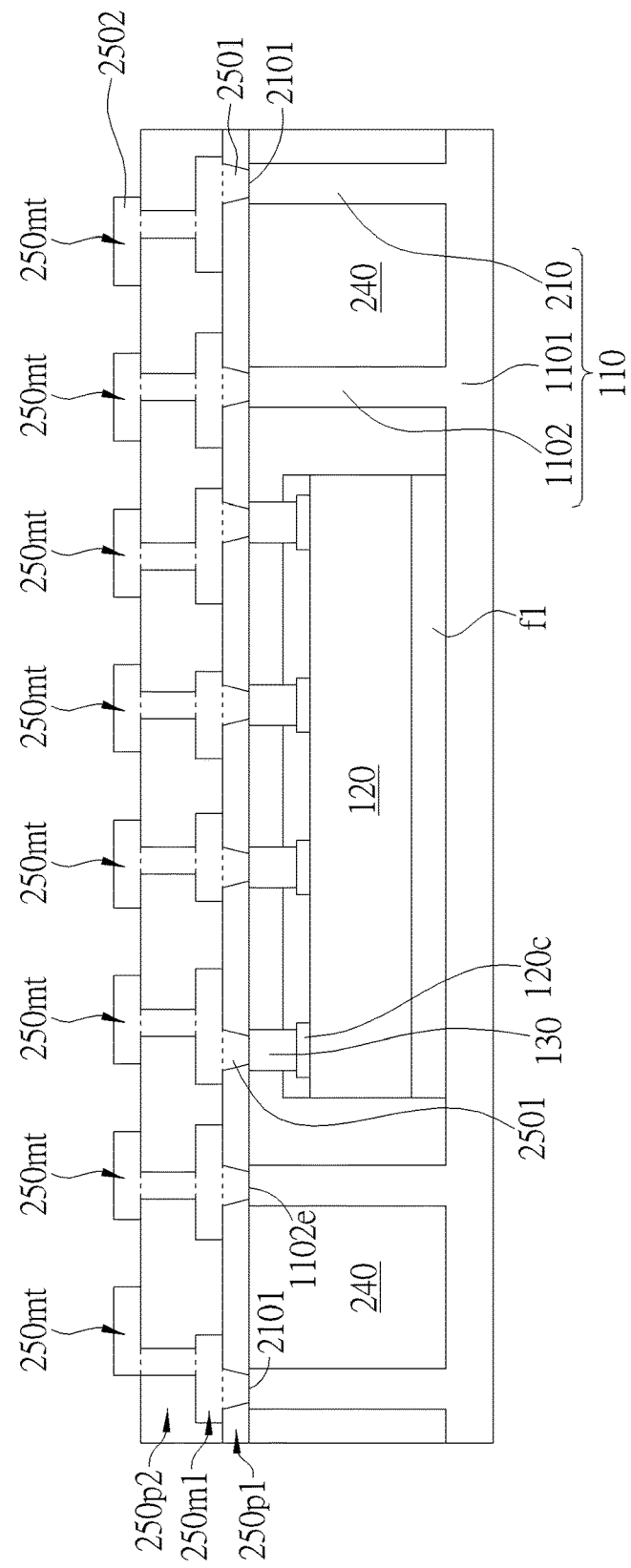

FIG. 12 may correspond to Step 1210. FIG. 13 may correspond to Steps 1220. FIG. 14 may correspond to Steps 1230-1240. FIGS. 15-17 may correspond to Steps 1250-1288. In Step 1240, a grinding process is performed to remove an undesired portion of the mold layer 240.

In Step 1210, according to other embodiments of the present invention, more than two supporting structures may be formed. The plurality of supporting structures may be used to form an array of pillars used for electrical connection for stacked packaging. The pitch between the pillars may be increased or decreased according to the requirement of the semiconductor package. In Steps 1220-1240, the recess 110r where the die 120 may be placed and the mold layer 240 are formed. In Steps 1250-1260, the redistribution layer 250 (as shown in FIG. 2) may be formed. And, the first solder balls 160 may be disposed onto the redistribution layer 250. In Step 1270, the first supporting structure 1102 and the second supporting structure 210 may be separated by etching the bottom portion 1101 of the one-piece metal carrier 110. Moreover, the second supporting structure 210 may be etched to form a plurality of pillars. The pillars formed by the second supporting structures 210 may be the pillars 210p described below and shown in a top view in FIG. 19.

Similar to the foresaid redistribution layer 150, the redistribution layer 250 may include dielectric layers 250p1, 250p2 and 250pt, and conductive layers 250m1 and 250mt as shown in FIGS. 15-16 and 2. The dielectric layers of the redistribution layer 250 may be formed and drilled to form paths. The conductive layers of the redistribution layer 250 may be formed, patterned and connected to one another via the paths through the dielectric layers to form the circuitry 250c. The numbers of the dielectric layer and the conductive layer of the redistribution layer 250 shown in FIGS. 15-16 and 2 may be shown as an example. Any number of dielectric/conductive layers may be formed in the redistribution layer 250. The first conductive layer 250m1 and/or the top conductive layer 250mt may be plated with a conductive seed layer by sputtering to improve accuracy of soldering the solder balls. A surface finish process may be performed to clean and flatten the interfaces 2502 and the auxiliary interfaces 2102 for the solder balls 160 and 220 to be better fixed. As shown in FIG. 2, at least a part of the bottom portion 1101 may be exposed for better heat dissipation. As mentioned above, a cutting process may be performed to separate a group of the package structures 200 from one another after the package structures 200 have been manufactured together with physically connecting to one another.

FIG. 17 illustrates a package structure 1700 according to an embodiment of the present invention. The package structure 1700 may be similar to the package structure 200 of FIG. 2. However, as shown in FIG. 17, the embodiment of the present invention has a backside of the heatsink (i.e. the one-piece metal carrier 110) covered by dielectric material and a solder mask. As shown in FIG. 17, the bottom portion 1101 may be covered by the dielectric layer 2301 and the solder mask layer 2302 with merely exposing the second auxiliary interfaces 2102. The package structure 200 shown in FIG. 2 may be formed by processing the package structure 1700 of FIG. 17 according to an embodiment. Regarding FIG. 17 and FIG. 2, after removing a portion of the dielectric layer 2301 and a corresponding portion of the solder mask layer 2302 of FIG. 17, a surface 1101e of the backside of the heatsink may be exposed to have an improved heat dissipation effect. Regarding package structures 100 (of FIG. 1), 200 (of FIG. 2) and 1700 (of FIG. 17) provided by embodiments of the present invention, the (conductive) supporting structures 1102 and 210 may improve the supporting strength of the heatsink (i.e. the one-piece metal carrier 110), act as conductive paths for improving design flexibility and provide good heat dissipation and electromagnetic interference (EMI) protection. A user may select a favorable type of package structures according to the product specifications.

Figure 18:
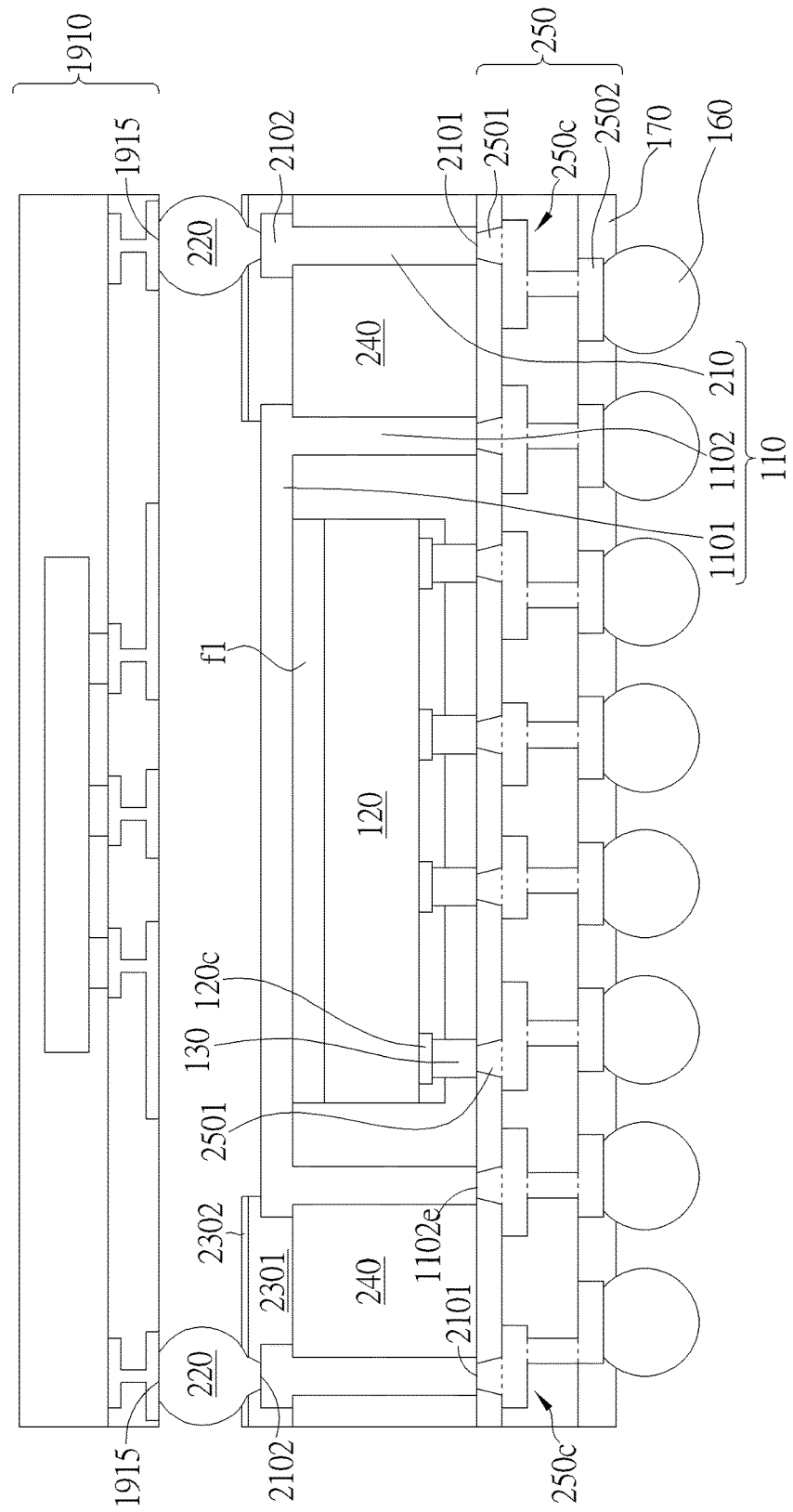
FIG. 18 illustrates a package-on-package structure including the package structure according to an embodiment of the present invention.

FIG. 18 illustrates a package-on-package (PoP) structure including the package structure 200 (shown in FIG. 2) according to an embodiment of the present invention. An external chip 1910 may be disposed on the solder balls 220 by coupling a plurality of interfaces 1915 of the external chip 1910 to solder balls 220. The external chip 1910 may electrically communicate with the die 120 via the solder balls 220, a set of pillars formed by the second supporting structure 210, the circuitry 250c and the conductive bumps 130.

Figure 19:
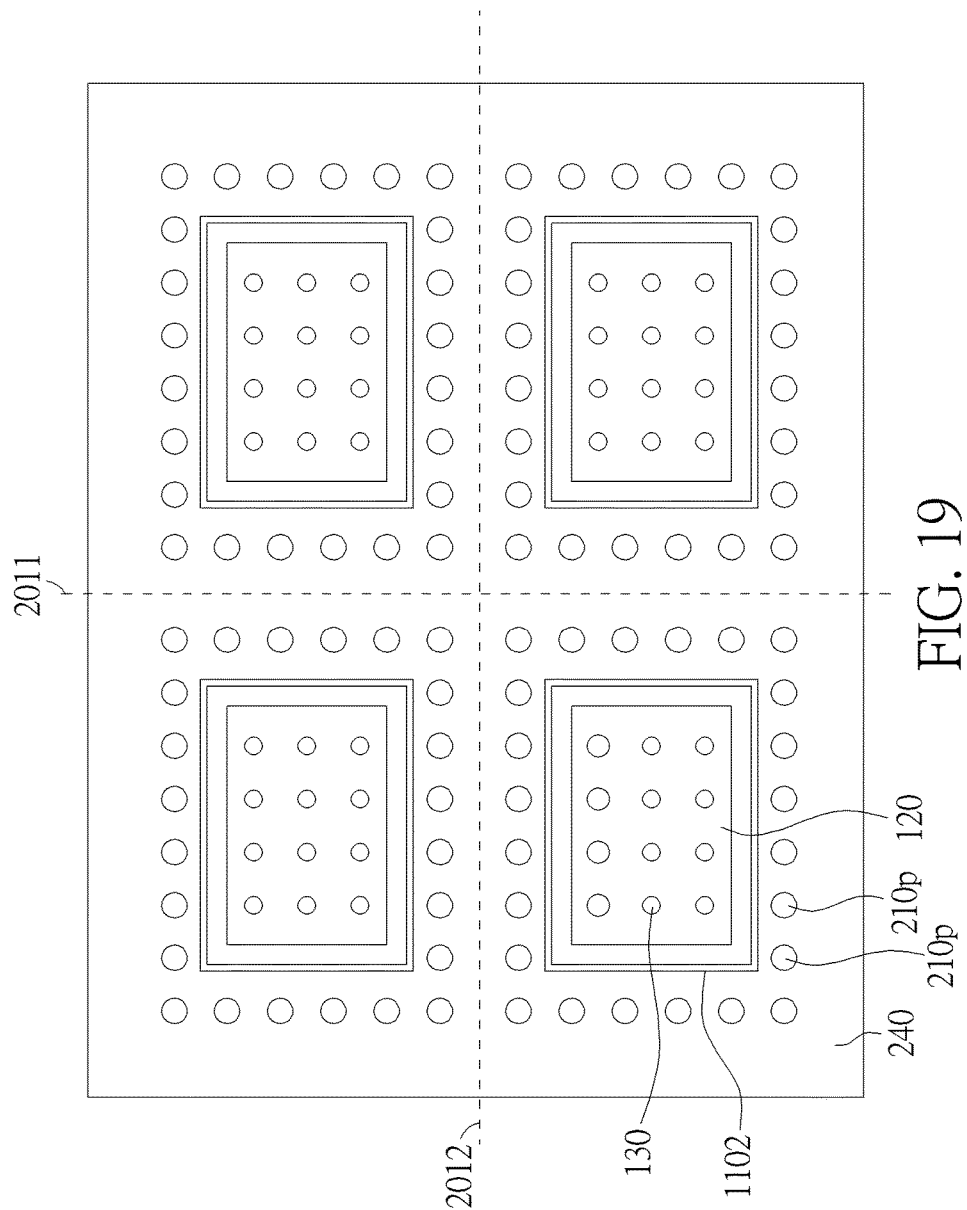
FIG. 19 illustrates a top view of multiple package structures manufactured in a batch according to an embodiment of the present invention.

FIG. 19 illustrate a top view of multiple package structures manufactured in a batch according to an embodiment of the present invention. As mentioned above and shown in FIG. 19, the second supporting structure 210 may be manufactured to form a set of pillars 210p arranged in a series and form a rectangle. The first supporting structure 1102 may surround the die 120 to provide electromagnetic shielding. As shown in FIG. 19, a plurality of package structures may be formed in an array. For example, in FIG. 19, four package structures may be shown. After producing the package structures, a cutting process may be performed along the lines 2011-2012 to separate the package structures.

In summary, by using the package process methods and package structures provided according to embodiments of the present invention, a fan-out structure may be obtained by etching a single conductive substrate to form a one-piece metal carrier having a recess acting as a heatsink for the die while improving EMI shielding, heat dissipation, and structural strength. A package-on-package structure may also be allowed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure comprising:
   a one-piece metal carrier including a bottom portion, a first supporting structure, and a second supporting structure separated by spaces from and surrounding the first supporting structure, the one-piece metal carrier having a recess defined by the bottom portion and the first supporting structure;
   a die disposed in the recess of the one-piece metal carrier, the die having a plurality of conductive bumps;
   a mold layer formed to encapsulate the die and fill the spaces between the first supporting structure and the second supporting structure, wherein the mold layer exposes a portion of each of the plurality of conductive bumps, a portion of the first supporting structure, and a portion of the second supporting structure; and
   a redistribution layer disposed on the mold layer, the first supporting structure, and the second supporting structure, and electrically connected to the plurality of conductive bumps.

2. The package structure of claim 1, wherein the one-piece metal carrier is a single conductive substrate having a recess defined by the bottom portion and the first supporting structure.

3. The package structure of claim 1, wherein the one-piece metal carrier is a single conductive substrate having the second supporting structure and a recess defined by the bottom portion and the first supporting structure.

4. The package structure of claim 1, wherein the second supporting structure comprises a plurality of pillars.

5. The package structure of claim 1, wherein at least a portion of the bottom portion and at least a portion of the second supporting structure is covered by a dielectric layer.

6. The package structure of claim 1, wherein the first supporting structure is electrically connected to the redistribution layer.

7. The package structure of claim 1, wherein the bottom portion of the one-piece metal carrier is exposed in the package structure.

8. The package structure of claim 1, further comprising:
   a plurality of first solder balls disposed on the redistribution layer.

9. The package structure of claim 1, further comprising:
   a protection layer disposed between the die and the one-piece metal carrier to adhere the die to the one-piece metal carrier such that die is thermal coupled with the bottom portion of the one-piece metal carrier, wherein the protection layer comprises at least one of an adhesive layer and a die attach film.

10. A package process method comprising:
    forming a one-piece metal carrier having a bottom portion, a first supporting structure, and a second supporting structure separated by spaces from and surrounding the first supporting structure, the bottom portion and the first supporting structure forming a recess;
    disposing a die within the recess;
    forming a mold layer to encapsulate the die and fill the spaces between the first supporting structure and the second supporting structure;
    grinding the mold layer to expose a portion of each of a plurality of conductive bumps of the die, a portion of the first supporting structure, and a portion of the second supporting structure; and
    forming a redistribution layer on the mold layer, wherein the redistribution layer is electrically connected to the plurality of conductive bumps, the first supporting structure, and the second supporting structure.

11. The method of claim 10, further comprising:
    disposing a protection layer between the die and the bottom portion.

12. The method of claim 10, further comprising:
    disposing a plurality of first solder balls on the redistribution layer.

13. The method of claim 10, wherein forming a one-piece metal carrier is etching a single conductive substrate to form the bottom portion and the first supporting structure.

14. The method of claim 10, wherein forming a one-piece metal carrier is etching a single conductive substrate to form the bottom portion, the first supporting structure, and the second supporting structure.

15. The method of claim 14, further comprising:
after forming the mold layer, etching the one-piece metal carrier to separate the second supporting structure from the bottom portion and the first supporting structure.

16. The method of claim 14, further comprising:
forming a dielectric layer to cover at least a portion of the bottom portion and at least a portion of the second supporting structure.

17. The method of claim 14, wherein the second supporting structure comprises a plurality of pillars.

18. The method of claim 17, further comprising:
disposing a plurality of first solder balls correspondingly on the plurality of pillars of the second supporting structure.

19. The method of claim 10, further comprising:
performing a cutting process to the one-piece metal carrier, the redistribution layer, and the mold layer to form a plurality of package structures.

20. The package structure of claim 4, further comprising a plurality of second solder balls correspondingly on ends of the plurality of pillars of the second supporting structure opposite to ends of the plurality of pillars contacting the redistribution layer.

* * * * *